United States Patent [19]

Harwood

[11] 4,051,519
[45] Sept. 27, 1977

[54] PHASE CONTROL CIRCUIT SUITABLE FOR USE IN A TINT CONTROL STAGE OF A COLOR TELEVISION SYSTEM

[75] Inventor: Leopold Albert Harwood, Somerville, N.J.

[73] Assignee: RCA Corporation, New York, N.Y.

[21] Appl. No.: 644,820

[22] Filed: Dec. 29, 1975

[51] Int. Cl.² .................................... H04N 9/535
[52] U.S. Cl. .................................. 358/21; 307/295; 358/28
[58] Field of Search .................. 358/28, 30, 21; 307/262, 232, 295

[56] References Cited
U.S. PATENT DOCUMENTS 3,255,305   6/1966   Chatten ............................. 358/28 X Primary Examiner—Richard Murray
Assistant Examiner—Mitchell Saffian
Attorney, Agent, or Firm—Eugene M. Whitacre; Ronald H. Kurdyla

[57] ABSTRACT

A controllable phase shifting circuit suitable for providing tint control in a color television system comprises first and second differential amplifiers, each providing antiphase outputs and supplied respectively with first and second alternating color reference signals which are in a first predetermined (e.g., quadrature) phase relation. A third signal, which is a fractional part of one of the first two signals, is combined with the other of the first two signals at its respective amplifier input to produce a fourth signal with a phase different from that of the first, second or third signals. A third amplifier provides differential gain control inputs to the first and second amplifiers. A combining circuit sums relatively in-phase or antiphase output signal components from the first and second amplifiers to produce an output signal with a desired phase (e.g., flesh tone phase). The desired phase is controllable in accordance with the gain control input signals such as can be developed in response to an adjustable tint control potentiometer or similar device.

22 Claims, 6 Drawing Figures

PHASE CONTROL CIRCUIT SUITABLE FOR USE IN A TINT CONTROL STAGE OF A COLOR TELEVISION SYSTEM

This invention relates to electronic phase control circuits and, more particularly, to phase control circuits such as may be employed as a tint control in the chrominance channel of a color television receiver.

In many types of electrical apparatus, there is a requirement for a phase control circuit having a range of operation which is predictable and substantially symmetrical or balanced with respect to a reference value.

Known types of phase control circuits typically employ fixed value or variable resistance-capacitance (RC) phase shift networks with or without active circuit devices to establish a desired center and range of phase control.

The range and symmetry characteristics of such phase shift networks are sensitive to deviations from nominal values of the resistive and capacitive elements. This effect is particularly troublesome in integrated circuit networks, since the absolute values of integrated resistors and capacitors may deviate by thirty percent or more from a nominal value. Furthermore, in the integrated circuit environment, deviations from nominal values on a given chip tend to be all in the same direction (e.g., high or low), thereby producing an accumulation of phase error in cascaded circuit components. The need for an external trim of adjusting potentiometer or variable reactive circuit to tailor the characteristics of the phase control circuit to compensate for these factors is generally undesirable, since such components are relatively costly and require the expenditure of one or more of the limited number of terminals of the integrated circuit. It is therefore generally preferable to avoid use of RC networks in areas where accurate phase control is important.

A controllable phase shifting circuit according to the invention comprises a source of first alternating signals and a source of second alternating signals in predetermined phase relation with the first signals. First and second amplifiers each have signal inputs respectively coupled to said sources of first and second alternating signals, and a gain control input. Gain control means are coupled to the gain control inputs of the first and second amplifiers for differentially controlling the signal gains thereof. Circuit means are also coupled from the source of first signals to the signal input of the second amplifier for developing a third alternating signal at the last-named input with a magnitude proportional to and a phase in predetermined relation with that of the first alternating signals. A combining network sums output signals from the first and second amplifiers to produce a resultant output signal with a phase within a range of phases between that of alternating signals applied to the signal input of the first amplifier and that of alternating signals applied to the signal input of the second amplifier, the phase of the resultant output signal being controlled in response to the gain control means.

Figure 1:
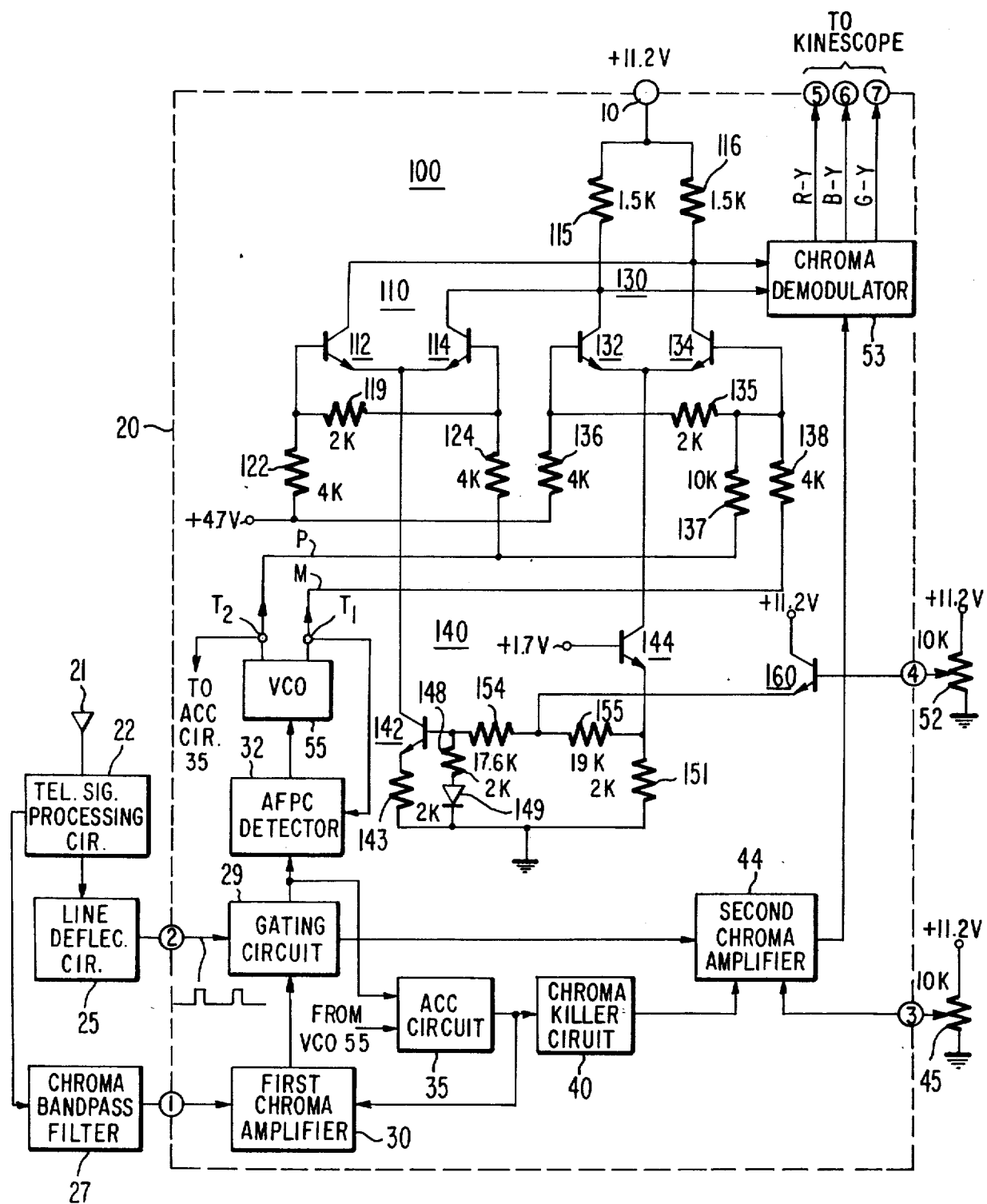
FIG. 1 is a diagram partially in block form and partially in schematic circuit form of a portion of a television receiver employing the invention.

Referring to FIG. 1, color television signals are received by an antenna 21 and are processed by television signal processing circuits 22 to provide, along with other conventional signal components, horizontal (line) synchronizing pulses which are coupled to line deflection circuits 25.

Detected video signals produced at the output of processing circuits 22 are coupled to a chroma bandpass filter 27 arranged to select a color burst component and color-representative signal information, the latter comprising, for example, color information signals imposed as amplitude modulation at selected phases of a suppressed color subcarrier wave. The color burst and modulated, suppressed subcarrier, color signals are coupled via an input terminal 1 of a chroma processing integrated circuit 20 to a first chroma amplifier 30.

Amplified signals from the first chroma amplifier 30 are supplied to a gating circuit 29 to which keying signals derived from the line deflection apparatus 25 also are supplied. The keying signal is illustrated as including positive-going pulses of relatively short duration (e.g., the line blanking interval) separated by a relatively longer duration interval (the image-representative portion of the line scanning cycle). Gating circuit 29 supplies amplified burst signals to an automatic frequency and phase control (AFPC) detector 32 and to an automatic color control (ACC) circuit 35.

The AFPC detector 32 is also supplied with a color reference signal from a first (quadrature) output terminal $T_1$ of a voltage controlled oscillator (VCO) 55. AFPC detector 32 provides control signals to a control input of VCO 55 to maintain the oscillatory reference signal in phase and frequency synchronism with the received burst signal. A suitable AFPC detector 32 is described in my U.S. Pat. No. 3,740,456 issued June 19, 1973 and VCO 55 may, for example, be of the type described in my copending U.S. Patent application Ser. No. 633,462, now U.S. Pat. No. 4,020,500, both assigned to RCA Corporation.

ACC circuit 35 is also supplied with a reference signal from a second (in-phase) output terminal $T_2$ of VCO 55, and provides a control voltage for controlling the gain of first chroma amplifier 30. The control voltage from ACC circuit 35 is also supplied to a color killer circuit 40 which is coupled to a second chroma amplifier 44.

A chroma gain (saturation) control potentiometer 45 is coupled to an operating voltage supply of, for example, +11.2 volts and has a wiper arm coupled to an input of second chroma amplifier 44 via a terminal 3.

A chroma demodulator 53 (which may include appropriate matrixing circuits) receives amplified chrominance subcarrier signals from the second chroma amplifier 44 and provides color difference signals R−Y, G−Y and B−Y at terminals 5, 6 and 7. Such color difference signals are ultimately combined with luminance (Y) signals to produce red (R), green (G) and blue (B) color-representative signal components which are applied to the kinescope (not shown) of the television receiver.

Chroma processing circuit 20 further includes a tint control stage constructed according to the present invention and indicated generally by the reference number 100.

Tint control stage 100 comprises first and second differential amplifiers 130 and 110 and a gain control circuit 140.

Amplifier 110 includes emitter coupled transistors 112 and 114, a load resistor 115 coupled from a collector of transistor 114 to an operating supply (+11.2 volts) via a terminal 10, and a load resistor 116 coupled from a collector of transistor 112 to the operating supply. A bias supply (+4.7 volts) is coupled via a resistor 122 to the base of transistor 112 and via an additional isolation resistor 119 to the base of transistor 114. The second output terminal $T_2$ of VCO 55 is coupled to the base of transistor 114 via a resistor 124 to supply continuous wave color reference subcarrier information (e.g., 3.58 MHz).

Amplifier 130 includes emitter coupled transistors 132 and 134. A collector of transistor 132 is connected to the collector of transistor 114 and to load resistor 115 to form a first combined signal output of tint control stage 100. A collector of transistor 134 is connected to the collector of transistor 112 and to load resistor 116 to form a second combined signal output. The bias supply (30 4.7 volts) is coupled via a resistor 136 to the base of transistor 132 and via an additional resistor 135 to the base of transistor 134. The output terminal $T_2$ of VCO 55 is coupled via a resistor 137 to the base of transistor 134, while output terminal $T_1$ of VCO 55 is coupled via a resistor 138 to the base of that same transistor 134. The interconnected collectors of transistors 114, 132 and 112, 134 are connected to reference signal inputs of chroma demodulator 53 for supplying push-pull, controllable phase, reference signals thereto.

Control circuit 140 includes transistors 142 and 144 arranged in differential input configuration, and a bias control transistor 160. A collector of transistor 142 is connected to the joined emitters of transistors 112 and 114 of amplifier 110, while the emitter thereof is returned to ground by a bias resistor 143. A series combination of a bias resistor 149 and a temperature compensation diode 149 is coupled between a base of transistor 142 and ground. A collector of transistor 144 is connected to the joined emitters of transistors 132 and 134 of amplifier 130, while the emitter thereof is returned to ground by a bias resistor 151. The base of transistor 144 is coupled to a bias supply of about +1.7 volts. A pair of series connected bias resistors 154 and 155 is coupled between the emitter of transistor 144 and the base of transistor 142. The point of interconnection of resistors 154 and 155 is connected to an emitter of bias control transistor 160. Transistor 160, which is arranged in an emitter follower configuration, includes a collector connected to the operating supply and a base coupled to a wiper arm of a tint control potentiometer 52 via a terminal 4.

Figure 2A:
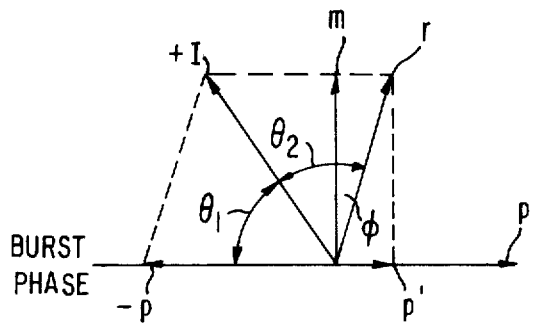
FIGS. 2a and 2b are vector diagrams illustrating operating conditions for the FIG. 1 embodiment for a first set of input signal conditions.

As is described in the above-mentioned copending application, VCO 55 provides a first oscillatory reference signal M (e.g., at 3.58 MHz) of a first phase at output terminal $T_1$, and a second oscillatory signal P which is in lagging quadrature phase relation with signal M at output terminal $T_2$. For proper demodulation of the received chrominance signal, color reference signal M may exhibit either a leading [−(R−Y) phase] or lagging [(R−Y) phase] quadrature relationship with respect to the received burst signal. In the latter case, the signal P is then opposite in phase with respect to burst. This condition is illustrated in FIG. 2a to which reference may be made in connection with the following description.

Resistor 124, which forms a voltage divider with resistors 119 and 122, couples an in-phase fraction (p) of signal P to the base of transistor 114. Amplified antiphase (−p) and in-phase (p) reference signals are produced at the outputs of transistors 114 and 112, respectively. Resistor 138, which forms a voltage divider with resistors 136 and 135, couples an in-phase fraction (m) of signal M to the base of transistor 134. In this example, the voltage dividers 124, 119, 122 and 138, 135, 136, respectively produce input signals p and m of substantially equal magnitude, the outputs P and M of oscillator 55 being equal in magnitude.

The signal P is also applied via resistor 137, which forms a voltage divider with resistors 135 and 136, to produce an in-phase fraction (p′) of signal P at the base of transistor 134. The magnitude of signal p′ is selected according to the range of phase control to be provided by tint control stage 100.

The signal p′ is summed with the signal m at the base of transistor 134 to form a combined signal (m + p′) which is hereafter designated as signal r, having a resultant phase intermediate m and p. Combined signal r is reproduced in amplified antiphase (−r) and in-phase (r) form at the collector outputs of transistors 134 and 132, respectively. The output signal developed across load resistor 115 at the joined collectors of transistors 114 and 132 therefore corresponds to (−p + r), and the signal developed across load resistor 116 at the joined collectors of transistors 112 and 134 corresponds to (p − r). These two signals are of opposite phase.

The magnitudes of the individual signal components p and r developed across load resistors 115 and 116 may be controlled by varying the conduction level or voltage gain of amplifiers 110 and 130. The gains of amplifiers 110 and 130 are differentially controlled by the current supply transistors 142 and 144 of control circuit 140. Transistors 142 and 144 in turn are controlled as a function of the control voltage applied from tint control potentiometer 52 to the base of transistor 142 and the emitter of transistor 144 via terminal 4, follower transistor 160 and bias resistors 154, 155. The values of resistors 154 and 155 are selected to provide a desired degree of control over the relatively conduction of transistors 142 and 144.

For example, when the wiper arm of potentiometer 52 is adjusted to the extreme position toward the operating supply voltage (+11.2 volts), transistor 144 and therefore amplifier 130 are rendered substantially non-conductive, while transistor 142 and amplifier 110 reach maximum conduction. At this control position, only in-phase and antiphase components of signal p are respectively developed across load resistors 116 and 115. Conversely, the conduction level of transistor 144 and amplifier 130 reach a maximum when potentiometer 52 is adjusted to the other extreme toward ground. In that case, transistor 142 and amplifier 110 are substantially cut-off so that only in-phase and antiphase components of signal r are respectively developed across load resistors 115 and 116. When potentiometer 52 is adjusted so that transistors 142, 144 and associated amplifiers 110, 130 conduct equally, signals p and r of equal magnitude are developed across output load resistors 115 and 116. For this condition a combined output signal (−p + r) is developed across resistor 115, and a combined opposite phase output signal (p − r) is developed across resistor 116.

In FIG. 2a, a signal +I is illustrated which corresponds to the flesh-tone phase of received image-representative chrominance signals. Under normal operating conditions, the +I signal forms a lagging phase angle $\theta_1$ of about 57° with the burst signal. The tint control stage 100 provides compensation for positive or negative phase variations by providing for symmetrical variation of the phase of a color reference signal output about the +I signal axis over a predetermined operating range between the phases of the signals p and r. The signal p' is selected (by means of resistors 137, 135, 136) to make this control range symmetrical about the I phase. That is, the +I signal is derived combining the −p and r signals in load resistor 115 to produce a combined signal −p+r (+I) at the joined collectors of transistors 114 and 132. When potentiometers 52 is adjusted so that amplifiers 110 and 130 conduct equally, equal amounts of the −p and r signals are combined in output load resistor 115. The +I signal therefore forms a lagging phase angle $\theta_1$ of about 57° with the burst signal for the normal signal condition, and also forms a leading phase angle $\theta_2$ equal to $\theta_1$ with signal r. The magnitude of phase angle $\theta_2$ is established by combining the predetermined portion of signal p, corresponding to signal p', with signal m to produce signal r in the manner previously discussed.

Figure 2B:
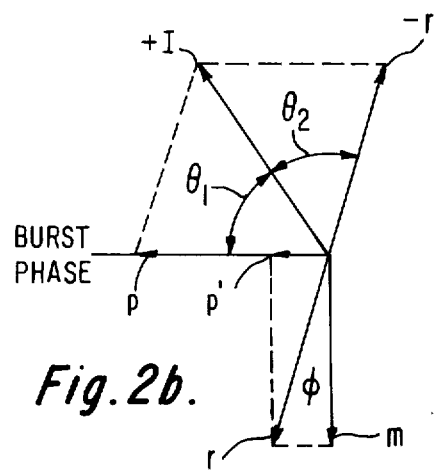

FIG. 2b illustrates the phase response of tint control circuit 100 when color reference signal M is in leading quadrature phase relation with the burst signal and P is in phase with the burst signal. In FIG. 2b the +I signal is derived by combining the p and −r signals in load resistor 116 to produce a combined signal p−r at the joined collectors of transistors 112 and 134. The combined signal corresponds to the desired +I signal with a phase and symmetrical range of phase control as described in connection with the +I signal of FIG. 2a.

Figure 3:
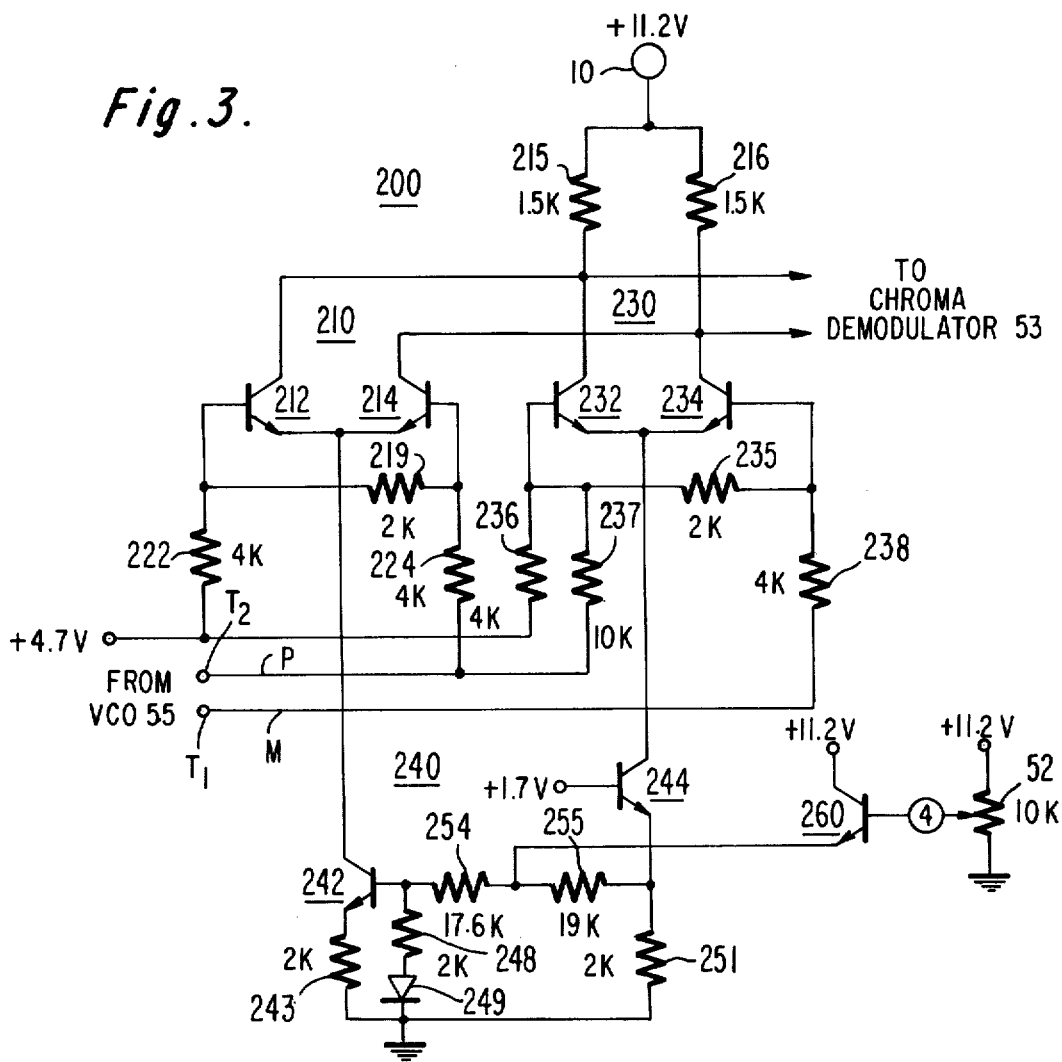
FIG. 3 is a circuit diagram of an alternate embodiment of the invention.

FIG. 3 depicts a tint control stage 200 comprising first and second similar differential amplifiers 230 and 210 with relatively in-phase outputs connected together, and a control circuit 240. In this example, while tint control stage 200 is similar to tint stage 100 in some respects, it differs as to the manner in which the collector outputs of amplifiers 210 and 230 are connected and in which input signals are applied.

Accordingly, a transistor 212 of amplifier 210 and a transistor 232 of amplifier 230 of amplifier 230 have respective collectors interconnected, and a transistor 214 of amplifier 210 and a transistor 234 of amplifier 230 have respective collectors interconnected. A first signal combining output load resistor 215 couples the interconnected collectors of transistors 212 and 232 to the operating supply at terminal 10, and a second signal combining output load resistor 216 couples the interconnected collectors of transistors 214 and 234 to the operating supply. The interconnected collectors of transistors 212, 232 and 214, 234 are respectively connected to inputs of chroma demodulator 53.

A resistor 224 and a resistor 237 respectively couple signals from output terminal $T_2$ of VCO 55 to a base of transistor 214 of amplifier 210 and to a base of transistor 232 of amplifier 230. A resistor 238 couples signals from output terminal $T_1$ of VCO 55 to a base of transistor 234 of amplifier 230.

Recall that VCO 55 may be arranged to provide an output oscillatory reference signal M which exhibits either a leading or lagging quadrature phase relationship with respect to the burst signals. In the case of FIG. 3, VCO 55 provides a first signal M in lagging quadrature relationship with respect to burst and a second reference signal P in leading quadrature phase relationship with signal M. The operation of tint control stage 200 is similar to that of tint control stage 100 except as follows.

Resistor 237 of tint control stage 200 couples the P signal to that end of resistor 235 which is remote from the base input of transistor 234 of amplifier 230. A fraction (p') of signal P appears at the base of transistor 232. A signal m is developed at the base of transistor 234 as previously explained in connection with FIG. 1. Signal currents corresponding to signals p' and m flow in opposite directions through resistor 235 (the base currents of transistors 232 and 234 being negligible), causing a differential signal voltage related to signals p' and m to appear across resistor 235. Considering the output from transistor 234, the signal voltage appearing across resistor 235 may be considered equal to(m−p'), hereinafter referred to as signal r, which produces an output −r at the collector of transistor 234. Furthermore, differential amplifier 230 amplifies the signal appearing across resistor 235 to produce an output +r at the collector of transistor 232.

The amplifier 210 provides outputs +p and −p at the collectors of transistors 212 and 214, respectively. Thus, the output signal developed across load resistor 215 at the joined collectors of transistors 212 and 232 corresponds to p+r, and the signal developed across load resistor 216 at the joined collectors of transistors 214 and 234 corresponds to −p−r. The relative magnitudes of signals p and r and the phases of these combined signals are controlled in response to the setting of potentiometer 52 as discussed in connection with FIG. 1.

Figure 4A:
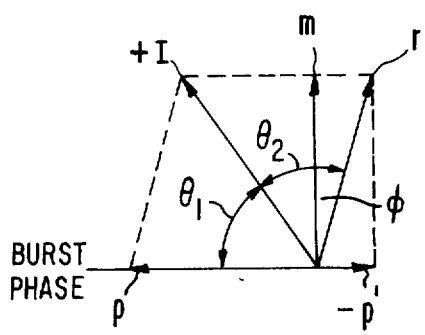
FIGS. 4a and 4b are vector diagrams illustrating operating conditions for the FIG. 3 embodiment for a second set of input signal conditions.
Figure 4B:
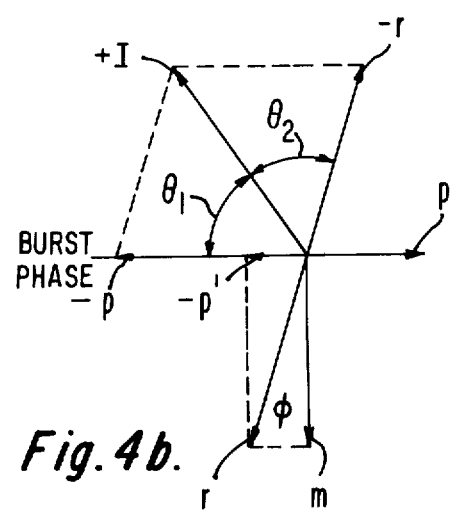

FIG. 4a illustrates the phase characteristic of tint control stage 200 when signal P from VCO 55 is in leading quadrature phase relation with signal M, which in turn is in lagging quadrature phase relation with the burst signal. In FIG. 4a the +I signal corresponds to the combined output signal p+r at the joined collectors of transistors 212 and 232. FIG. 4b illustrates the phase characteristics of tint control stage 20 when signal M is in leading quadrature phase relation with the burst signal. In FIG. 4b the +I signal corresponds to the combined output signal =p−r at the joined collectors of transistors 214 and 234.

Phase angles $\theta_1$ and $\theta_2$ and the +I signal shown in FIGS. 4a and 4b relate to the corresponding phase angles and +I signal of FIGS. 2a and 2b. Tint control stage 200 provides the desired +I signal with a phase and symmetrical range of phase control as discussed in connection with tint control stage 100.

It will be observed that signals p and m of FIG. 2a are in antiphase relation (i.e., rotated 180°) with respect to signals p and m of FIG. 2b. For either of the signal conditions shown by FIGS. 2a or 2b, the desired +I output signal and symmetrical phase response is provided at the push-pull outputs of tint control stage 100. Although tint control stage 100 has been disclosed as providing push-pull output signals developed across resistors 115 and 116, it is noted that FIGS. 2a and 2b and the associated description are intended also to illustrate how a desired signal phase (e.g., +I) may be developed and symmetrically controlled for either of the two input signal conditions (indicated by FIGS. 2a and 2b), from an amplifier which may provide only a single-ended signal output (i.e., an amplifier which may employ only a single load resistor corresponding to either resistor 115 or 116 of amplifiers 110, 130). The preceding commments likewise apply for tint control stage 200 of FIG. 3 and the associated FIG. 4a and 4b diagrams which illustrate a second set of input signal conditions.

It is also noted that the magnitude of phase angle $\phi$ formed by signals $m$ and $r$, and hence the magnitude of $\theta_2$, may be altered by adjusting the magnitude of signal $p'$ to achieve a desired range of phase control to suit the requirements of a particular circuit use. Such an alteration involves only a different resistor ratio (a relatively accurately controlled parameter) and does not require the use of capacitors or other reactive devices.

Although the invention has been disclosed in terms of particular circuit embodiments, it should be recognized that other arrangements may be devised by those skilled in the art without departing from the scope of the invention.

For example, the signal M may also be coupled by means such as an additional resistor (not shown) to the base input of transistor 114 in FIG. 1 or, in the case of FIG. 3, to the base input of transistor 212 to increase the operating flexibility of the respective circuits by developing an additional alternating input signal (i.e., $m'$ or $-m'$) of a desired magnitude and phase at such inputs. The additional input signal, in conjunction with input signal $p$ at such inputs, provides a further expanded phase control range in a manner analogous to that by which signals $p'$ and $-p'$ serve to provide an expanded phase control range as discussed. From the previous discussion and associated figures, it should also be recognized that the signals $p'$ and $-p'$ may be utilized to provide a compressed phase control range (less than that between P and M) and that the signals $m'$ and $-m'$ additionally may be employed to provide a further degree of phase control range compression. Thus, it will be appreciated that various combinations of reference input signals of selected phases and magnitudes may be used to tailor the circuit phase response to suit a particular circuit application.

Active signal combining circuits may be used in place of disclosed signal combining load resistors 115, 116 and 215, 216, and single-ended amplifier outputs may be provided. Moreover, control circuits 140 and 240 may comprise emitter coupled differential amplifier stages, and the roles of the amplifier stages 110, 130 and 210, 230 and the associated control circuits 140 and 240 may be reversed.

What is claimed is:

1. A controllable phase shifting circuit comprising:
   a source of first alternating signals desirably having a first predetermined phase relationship with respect to a reference phase;
   a source of second alternating signals desirably having a second determined phase relationship, different from said first phase relationship, with respect to said reference phase;
   first amplifier means having a signal input coupled to said source or first signals, and a gain control input;
   second amplifier means having a signal input coupled to said source of second signals, and a gain control input;
   circuit means coupled from said second source of signals to said signal input of said first amplifying means for coupling to said last-named input a third alternating signal with a magnitude proportional to and a phase in predetermined relation with that of said second alternating signals;
   combining means for summing output signals from said first and second amplifier means to produce a resultant output signal; and
   gain control means having first and second gain control signal outputs respectively coupled to separate ones of said gain control inputs of said first and second amplifier means for controlling the signal gains thereof in complementary fashion
   to vary the phase of said resultant output signal within a range of phases between that of a resultant of the alternating signals applied to said signal input of said first amplifier means and that of alternating signals applied to said signal input of said second amplifier means, without disturbing the phase relationship of said first and second alternating signals with respect to said reference phase.

2. A circuit according to claim 1 wherein the magnitudes of said first and second alternating signals are in predetermined proportional relationship and said resultant output signal has a phase within a range of phases between that of said second alternating signal and that of a sum of said first and third alternating signals.

3. A circuit according to claim 2 wherein the magnitudes of said first and second alternating signals are substantially equal.

4. A circuit according to claim 3 wherein said first and second signals are in quadrature phase relationship.

5. A circuit according to claim 1 wherein said first and second signals are in quadrature phase relationship and are substantially equal in magnitude, and wherein said circuit is included in a system comprising:
   utilization means responsive to said first and second alternating signals independent of the operation of said gain control means.

6. A circuit according to claim 1 wherein said second signal is in lagging phase relation with said first signal, said circuit means is coupled from said source of second alternating signals to said signal input of said first amplifier means for coupling said third signal in in-phase relation with said second signals, and said combining means sums relatively antiphased output signals of said first and second amplifier means.

7. A circuit according to claim 6 and further comprising:
   additional circuit means coupled from said source of first alternating signals to said signal input of said second amplifier means for coupling to said last-named input a fourth alternating signal with a magnitude proportional to and a phase in in-phase relation with that of said first alternating signals.

8. A circuit according to claim 1, wherein said second signal is in leading phase relation with said first signal, said circuit means is coupled from said source of second alternating signals to said signal input of said first amplifier means for coupling said third signal in antiphase relation with said second signal, and said combining means sums relatively in-phase output signals of said first and second amplifier means.

9. A circuit according to claim 8 and further comprising:
   additional circuit means coupled from said source of alternating signals to said signal input of said second amplifier means for coupling to said last-named input a fifth alternating signal with a magnitude proportional to and a phase in antiphase relation with that of said first alternating signals.

10. A circuit according to claim 1 wherein said combining means comprises a broad bandwidth impedance network.

11. A controllable phase shifting circuit comprising:
    a source of first alternating signals desirably having a first predetermined phase relationship with respect to a reference phase;

a source of second alternating signals desirably having a second predetermined phase relationship, different from said first phase relationship, with respect to said reference phase, said second signals being in lagging phase relationship with said first signals;

a first differential amplifier comprising first and second emitter coupled transistors each having an input terminal, a gain control terminal, and a collector output terminal;

a second differential amplifier comprising third and fourth emitter coupled transistors each having an input terminal, a gain control terminal, and a collector output terminal, said collector output terminals of said third and fourth transistors being respectively connected to relatively antiphased collector output terminals of said second and first transistors;

a first input signal network coupled from said source of second signals to at least one of said input terminals of said second amplifier;

a second input signal network coupled from said source of second signals to at least one of said input terminals of said first amplifier for coupling thereto a third alternating signal with a magnitude proportional to and a phase in in-phase relation with that of said second signals, and coupled from said source of first signals to said last-named input terminal;

a signal combining impedance network coupled at least to one pair of relatively antiphased collector output terminals of said first and second amplifiers for summing output signals from said first and second amplifiers to produce a resultant output signal; and a third differential amplifier comprising fifth and sixth transistors with collector outputs respectively coupled to said gain control terminals of said first and second amplifiers for differentially controlling the signal gains of said first and second amplifiers to vary the phase of said resultant output signal within a range of phases between that of a resultant of the alternating signals applied to said input terminal of said first amplifier and that of alternating signals applied to said input terminal of said second amplifier, without disturbing the phase relationship of said first and second alternating signals with respect to said reference phase.

12. A circuit according to claim 11 wherein:

said collector outputs of said fifth and sixth transistors are respectively coupled to joined emitters of said first and second transistors of said first amplifier and to joined emitters of said third and fourth transistors of said second amplifier; and said first and second input signal networks are respectively coupled to base electrodes of said transistors of said second and first amplifiers.

13. A circuit according to claim 12 wherein said impedance network comprises a first resistance coupled to interconnected collectors of said first and fourth transistors, and a second resistance coupled to interconnected collectors of said second and third transistors.

14. A circuit according to claim 13 wherein said first input network comprises:

a third resistance coupling said second alternating signals to a base of said fourth transistor;

a fourth resistance coupling a base of said third transistor to a bias potential; and a fifth resistance coupled between said base electrodes of said third and fourth transistors.

15. A circuit according to claim 14 wherein said second input network comprises:

a sixth resistance coupling said first alternating signals to a base of said second transistor;

a seventh resistance coupling said second alternating signals to said base of said second transistor;

an eighth resistance coupling a base of said first transistor to a bias potential; and a ninth resistance coupled between said base electrodes of said first and second transistors.

16. A phase control circuit according to claim 15 wherein:

said fifth transistor of said third differential amplifier additionally has an emitter coupled to a reference potential and a base coupled to a circuit point;

said sixth transistor has a base coupled to a bias potential and an emitter coupled to said reference potential and to said circuit point; and a source of control potential coupled to said circuit point for differentially varying the condition of said fifth and sixth transistors in response to the magnitude of said control potential.

17. A controllable phase shifting circuit comprising:

a source of first alternating signals desirably having a first predetermined phase relationship with respect to a reference phase;

a source of second alternating signals desirably having a second predetermined phase relationship, different from said first phase relationship, with respect to said reference phase, said second signals being in leading phase relationship with said first signals;

a first differential amplifier comprising first and second emitter coupled transistors each having an input terminal, a gain control terminal, and a collector output terminal, said collector output terminals of said third and fourth transistors being respectively connected to relatively in-phase collector output terminals of said first and second transistors;

a first input signal network coupled from said source of second signals to at least one of said input terminals of said second amplifier;

a second input signal network coupled from said source of second signals to at least one of said input terminals of said first amplifier for coupling thereto a third alternating signal with a magnitude proportional to and a phase in antiphase relation with that of said second signals, and coupled from said source of first signals to said last-named input terminal;

a signal combining impedance network coupled at least to one pair of relatively in-phase collector output terminals of said first and second amplifiers for summing output signals from said first and second amplifiers to produce a resultant output signal; and a third differential amplifier comprising fifth and sixth transistors with collector outputs respectively coupled to said gain control terminals of said first and second amplifiers for differentially controlling the signal gains of said first and second amplifiers to vary the phase of said resultant output signal within a range of phases between that of a resultant of the alternating signals applied to said input terminal[s] of said first amplifier and that of alternating signals applied to said input terminal of said second amplifier, without disturbing the phase relationship of said first and second alternating signals with respect to said reference phase.

18. A circuit according to claim 17 wherein:
said collector outputs of said fifth and sixth transistors are respectively coupled to joined emitters of said first and second transistors of said second amplifier and to joined emitters of said third and fourth transistors of said first amplifier; and
said first and second input signal networks are respectively coupled to base electrodes of said transistors of said second and first amplifiers.

19. A circuit according to claim 18 wherein said impedance network comprises a first resistance coupled to interconnected collectors of said first and third transistors, and a second resistance coupled to interconnected collectors of said second and fourth transistors.

20. A circuit according to claim 19 wherein said first input network comprises:
a third resistance coupling said second alternating signals to a base of said fourth transistor;
a fourth resistor coupling a base of said third transistor to a bias potential; and
a fifth resistance coupled between said base electrodes of said third and fourth transistors.

21. A circuit according to claim 20 wherein said second input network comprises:
a sixth resistance coupling said first alternating signals to a base of said second transistor;
a seventh resistance coupling said second alternating signals to said base of said first transistor;
an eighth resistance coupling a base of said first transistor to a bias potential; and
a ninth resistance coupled between said base electrodes of said first and second transistors.

22. In a color television receiver for receiving and processing a color television signal including a color information component and a color synchronizing burst component having a prescribed phase and frequency, said receiver including an oscillator providing a first oscillatory signal with a frequency substantially equal to the frequency of said burst component and in quadrature phase relation therewith and a second oscillatory signal in quadrature phase relation with said first signal, phase control apparatus comprising:
a first amplifier having a signal input coupled to said first signals, and a gain control input;
a second amplifier having a signal input coupled to said second signals, and a gain control input;
circuit means coupled from said source of second signals to said signal input of said first amplifier for coupling to said last-named input a third alternating signal with a magnitude proportional to and a phase in predetermined relation with that of said second signals;
a combining circuit for summing output signals from said first and second amplifier to produce a resultant output signal; and
gain control means having first and second gain control signal outputs respectively coupled to separate ones of said gain control inputs of said first and second amplifiers for controlling the signal gains thereof in complementary fashion to vary the phase of said resultant output signal within a range of phases between that of a resultant of the alternating signals applied to said signal input of said first amplifier and that of alternating signals applied to said signal input of said second amplifier, without disturbing the phase relationship of said first and second signals and said burst component.

* * * * *